US008677289B1

(12) United States Patent
Chen

(10) Patent No.: US 8,677,289 B1
(45) Date of Patent: Mar. 18, 2014

(54) METHOD OF GENERATING ASSISTANT FEATURE

(75) Inventor: Shu-Hao Chen, New Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/615,632

(22) Filed: Sep. 14, 2012

(51) Int. Cl.
*G06F 17/50* (2006.01)

(52) U.S. Cl.
USPC .......................................................... 716/53

(58) Field of Classification Search
None
See application file for complete search history.

(56) References Cited

U.S. PATENT DOCUMENTS

| 7,487,490 | B2 * | 2/2009 | Zhang et al. ..................... 716/50 |
| 8,111,921 | B2 * | 2/2012 | Hsu et al. ....................... 382/181 |
| 2008/0178140 | A1 * | 7/2008 | Lin et al. ......................... 716/19 |
| 2010/0325591 | A1 * | 12/2010 | Lippincott et al. ............... 716/54 |
| 2011/0124193 | A1 * | 5/2011 | Cheng et al. ................... 438/669 |
| 2011/0294239 | A1 * | 12/2011 | Kodama et al. ................. 438/16 |

OTHER PUBLICATIONS

Miyama et al., "Large-Area Optical Proximity Correction with a Combination of Rule-Based and Simulation-Based Methods," Jpn. J. Appl. Phys. vol. 35, Part 1, No. 12B, Dec. 1996, pp. 6370-6373.*
Park et al., "A hybrid PPC method based on the empirical etch model for the 0.14(micro)m DRAM generation and beyond," Proceedings of the Int'l Symposium on Quality Electronic Design, 2002 IEEE, 5 pages.*
Gu et al., "Optical Proximity Correction With Linear Regression," IEEE Transactions on Semiconductor Manufacturing, vol. 21, No. 2, May 2008, pp. 263-271.*
Hung, "Hybrid optical proximity correction—concepts and results," $22^{nd}$ Annual BACUS Symposium on Photomask Technology, Proc. of SPIE vol. 4889, 2002 SPIE, pp. 1173-1180.*
Kotani et al., "Advanced Hybrid Optical Proximity Correction System with OPC Segment Library and Model-based Correction Module," Optical Microlithography XV, Proc. of SPIE vol. 4691, 2002 SPIE, pp. 188-195.*

* cited by examiner

*Primary Examiner* — Leigh Garbowski
(74) *Attorney, Agent, or Firm* — Jiang Chyun IP Office

(57) ABSTRACT

A method of generating an assistant feature is provided. A plurality of main features is provided. A first main feature is selected from the main features. A plurality of rule-based features is disposed around the first main feature. A model-based feature is generated around the first main feature. An overlap Boolean feature is extracted from the rule-based features, wherein the overlap Boolean feature overlaps with the model-based feature in an overlap ratio up to a target value. The overlap Boolean feature serves as an assistant feature, and the assistant feature and the first main feature constitute a transfer feature.

10 Claims, 4 Drawing Sheets

METHOD OF GENERATING ASSISTANT FEATURE

BACKGROUND OF THE INVENTION

1. Field of Invention

The present invention relates to a method of generating a feature, and more generally to a method of generating an assistant feature.

2. Description of Related Art

In the very advanced fabrication technology of integrated circuits, to reduce the dimensions of devices and to increase the degree of integration are leading trends and topics for further development. The photolithography process is one of the most crucial factors to determine the reliability and performance of devices. The increased degree of integration causes the shrinkage of devices and a reduced distance between devices. A deviation is thus easily caused while transferring a feature from a photomask to a layer on a wafer. For example, when a mask feature is transferred to a layer on a wafer using a photolithography process, the angles on the feature become less sharp, the tail of the feature shrinks, and line-width increases or decreases etc. This is what is known as the Optical Proximity Effect (OPE). In the integrated circuits with a greater device dimension or a lower degree of integration, this deviation does not have an extremely adverse effect. However, in the integrated circuits with a higher degree of integration, this deviation may deteriorate the performance of devices. For example, in high-integration ICs, the distance between devices is small. Thus, when the line widths of features transferred to the wafer expand unexpectedly, the features may partially overlap to cause a short circuit.

Therefore, in the integrated circuits with a higher degree of integration, the Optical Proximity Correct (OPC) is adopted to resolve the Optical Proximity Effect (OPE). The Optical Proximity Correct (OPC) uses, for example, rule-based or model-based approaches to generate assistant features on the photomask. In a photolithography process, the assistant features can produce destructive interference to the light, and thus accurate features are formed on a substrate after exposure. However, most of the assistant features generated by the existing model-based approach are extremely accurate assistant features calculated by the program. Therefore, it takes a long time to calculate the accurate assistant features in the model-based approach.

SUMMARY OF THE INVENTION

Accordingly, the present invention provides a method of generating an assistant feature. The method can significantly reduce the running time for calculating the accurate assistant features only with the model-based approach.

The present invention provides a method of generating an assistant feature. A plurality of main features is provided. A first main feature is selected from the main features. A plurality of rule-based features is disposed around the first main feature. A model-based feature is generated around the first main feature. An overlap Boolean feature is extracted from the rule-based features, wherein the overlap Boolean feature overlaps with the model-based feature in an overlap ratio up to a target value. The overlap Boolean feature serves as an assistant feature, and the assistant feature and the first main feature constitute a transfer feature.

According to an embodiment of the present invention, a profile of the rule-based features is determined by a simulation software.

According to an embodiment of the present invention, the method further includes forming the assistant feature around each of the main features other than the first main feature.

According to an embodiment of the present invention, the rule-based features are adjacent to each other.

According to an embodiment of the present invention, the transfer feature is written to a mask.

According to an embodiment of the present invention, the mask is a photomask.

According to an embodiment of the present invention, the photomask is used for a patterning process with a positive photoresist or a negative photoresist.

According to an embodiment of the present invention, the assistant feature includes a scattering bar.

According to an embodiment of the present invention, the transfer feature is input into a writing equipment.

According to an embodiment of the present invention, the writing equipment includes a photomask writing equipment.

In view of the above, in the method of generating an assistant feature of the present invention, a plurality of rule-based features are pre-distributed, and a model-based feature is then compared to the rule-based features to extract an overlap Boolean feature from the rule-based features. Such method can significantly reduce the running time for calculating the accurate assistant features only with the model-based approach, and the required assistant features can be obtained in a more efficient way.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
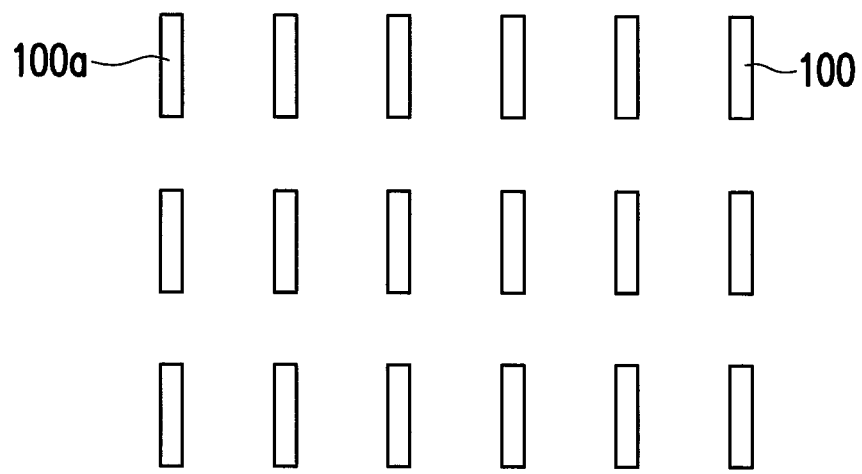
FIG. 1A to FIG. 1F are schematic views illustrating a method of generating an assistant feature according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1F are schematic views illustrating a method of generating an assistant feature according to an embodiment of the present invention.

Referring to FIG. 1A, a plurality of main features 100 is provided. Each main feature 100 can be a feature in a memory array, but the present invention is not limited to this. The arrangement of the main features 100 is not particularly limited herein. The present embodiment in which each main feature 100 has a rectangular shape is provided for illustration purposes, and is not construed as limiting the present invention. In another embodiment, each main feature 100 can be circular or triangular, or can be any feature suitable for transferring. In other words, the shape and arrangement of the main features 100 are not limited by the present invention.

Figure 1B:
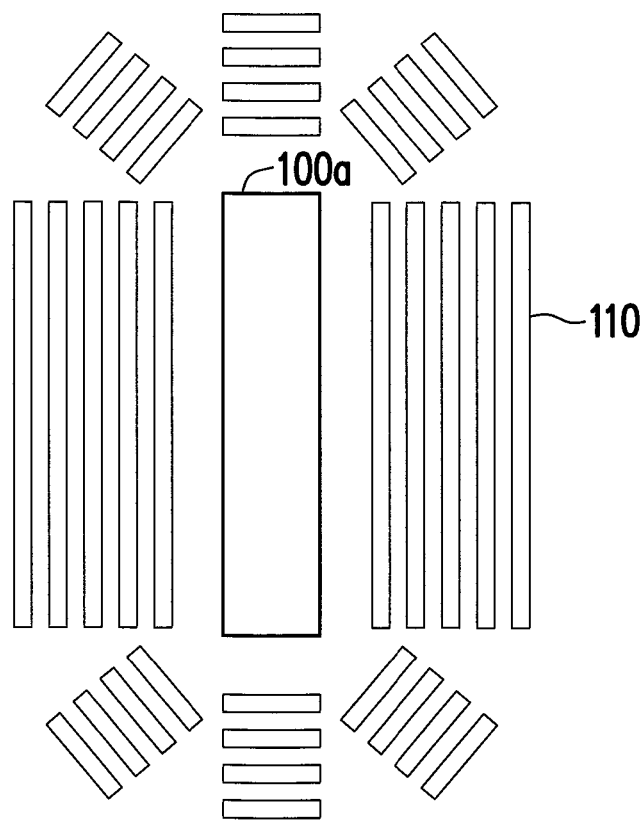

Referring to FIG. 1B, a first main feature 100a is selected from the main features 100. A plurality of rule-based features 110 is disposed around the first main feature 100a. The profile of the rule-based features 110 can be determined by a simulation software. The rule-based features 110 can have the same or different profile. The rule-based features 110 can have the same or different dimensions. The respective rule-based features 110 are distributed around the first main feature 100a by automation according to a simple rule. The rule-based features 110 can be automatically generated, so as to minimize human judgements. The simple rule includes a length, a width, a direction of the respective rule-based features 110. In an embodiment, each of the rule-based features 110 has a width about 1 nm. In another embodiment, each of the rule-based features 110 has a width about 0.5 nm. However, the present invention is not limited thereto.

In addition, in the present invention, the rule-based features 110 are adjacent to each other. However, the present invention is not limited thereto. In another embodiment, the rule-based features 110 can be separated farther from each other to reduce the number of the rule-based features 110. That is to say, the number and arrangement of the rule-based features 110 can be adjusted upon the requirements, and any number of the rule-based features 110 in any arrangement is possible.

Figure 1C:
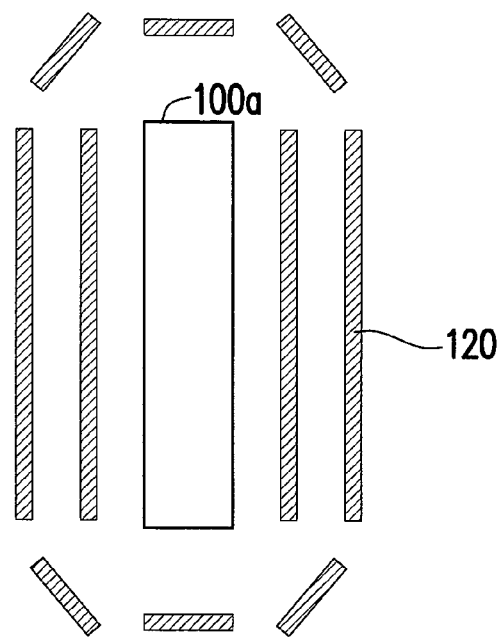

Referring to FIG. 1C, a model-based feature 120 is generated around the first main feature 100a. The model-based feature 120 includes a profile generated by any suitable feature calculation program. Factors such as the wavelength of an exposure light, the type of an exposure machine, and the node of a transfer feature, etc during the feature transfer are taken into consideration in the calculation method of the model-based feature 120. As compared to the rule-based features 110, the model-based feature 120 is more approximate to the required assistant feature. However, these factors make the calculation program of the model-based feature 120 more sophisticated and complicated. The calculation method or the calculation program of the model-based feature 120 is not limited by the present invention.

Figure 1D:
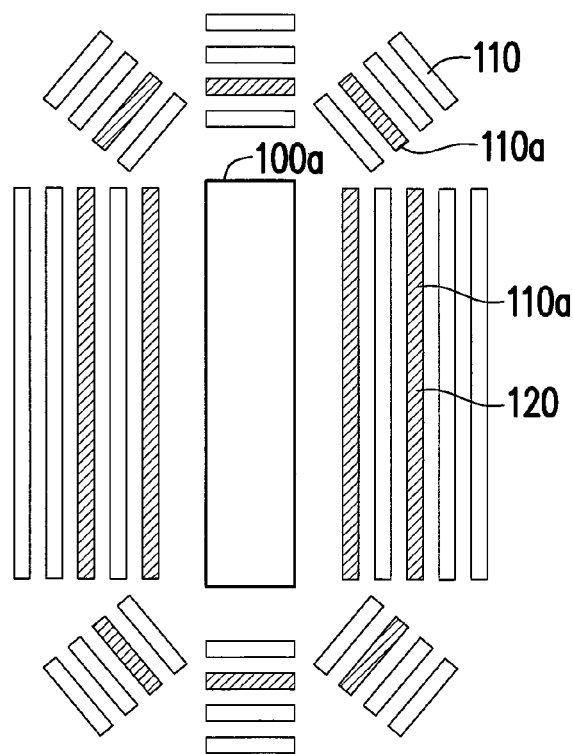

Referring to FIG. 1D, it is determined whether an overlap Boolean feature 110a is present in the rule-based features 100, wherein the overlap Boolean feature 110a overlaps with the model-based feature 120 in an overlap ratio up to a target value. If no feature in the rule-based features 110 overlaps with the model-based feature 120 in an overlap ratio up to the target value, physical amounts of the rule-based features 110 can be changed (e.g. reducing the width of the rule-based features, changing the length or shape of the rule-based features), and new rule-based features having a different dimension from the original rule-based features are distributed around the first main feature 100a The above steps are repeated until the overlap Boolean feature 110a overlaps with the model-based feature 120 in an overlap ratio up to the target value. The target value can be set according to the actual requirements. The target value can be 50-100%, for example. In an embodiment, the target value can be 70% or above. In another embodiment, the target value can be 80% or above. In yet an embodiment, the target value can be 90% or above. In the figure of the present embodiment, the overlap Boolean feature 110a completely overlaps with the model-based features 120. However, the present invention is not limited thereto.

Figure 1E:
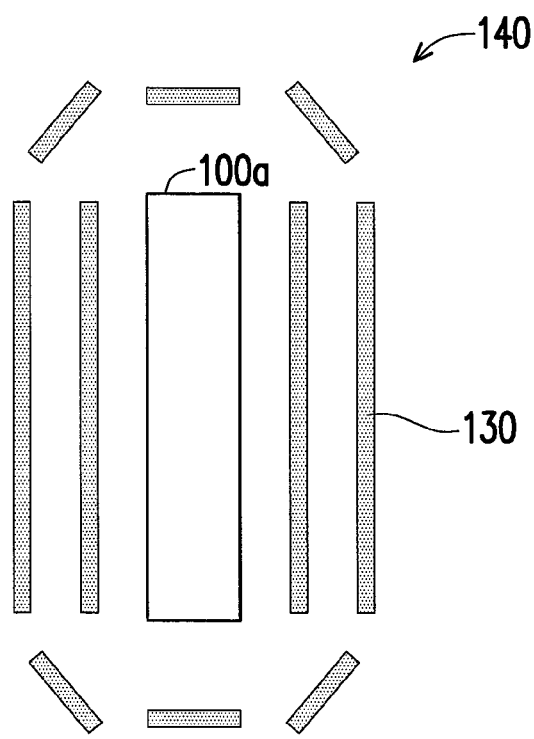

Referring to FIG. 1E, the overlap Boolean feature 110a is extracted from the rule-based features 110 and serves as an assistant feature 130. The assistant feature 130 and the first main feature 100a constitute a transfer feature 140. The extraction method of the overlap Boolean feature 110a includes selecting the corresponding rule-based feature 110, which overlaps with the model-based feature 120 in an overlap ratio up to the target value, by the program. In addition, when the transfer feature 140 is applied to a photomask fabrication process, the assistant feature 130 includes a scattering bar.

Figure 1F:
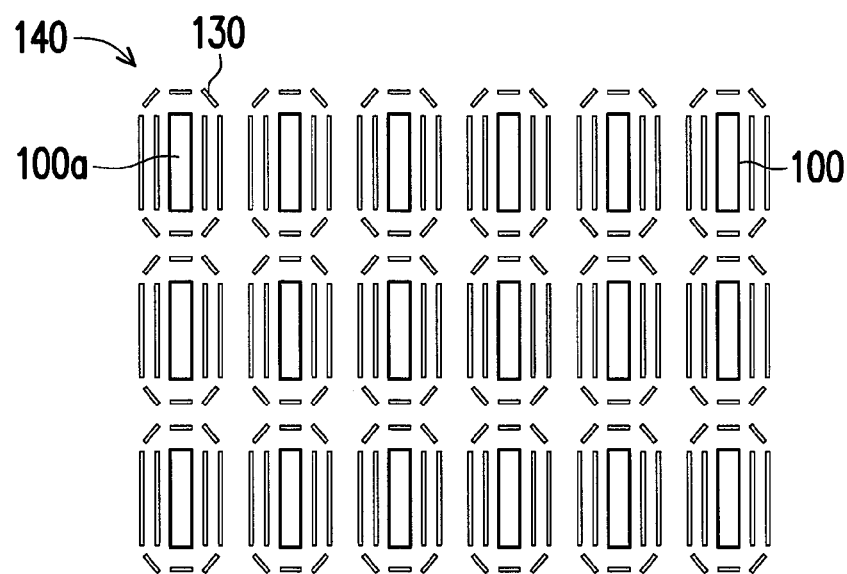

Referring to FIG. 1F, the assistant feature 130 is formed around each the first main feature 100a.

With the above-mentioned method, rule-based features are generated around only one main feature selected from a plurality of main features, and generating rule-based features around each main feature is not necessary. Therefore, the calculation time for generating rule-based features around each main feature can be saved, and multiple transfer features can be generated in a more efficient way. Besides, the overlap ratio of the extracted overlap Boolean feature to the model-based feature can be set according to the actual requirements. When a higher target value is set, the accuracy of the obtained assistant feature can be almost comparable to that of the model-based assistant feature. Thus, the process window can be broadened.

Figure 2:
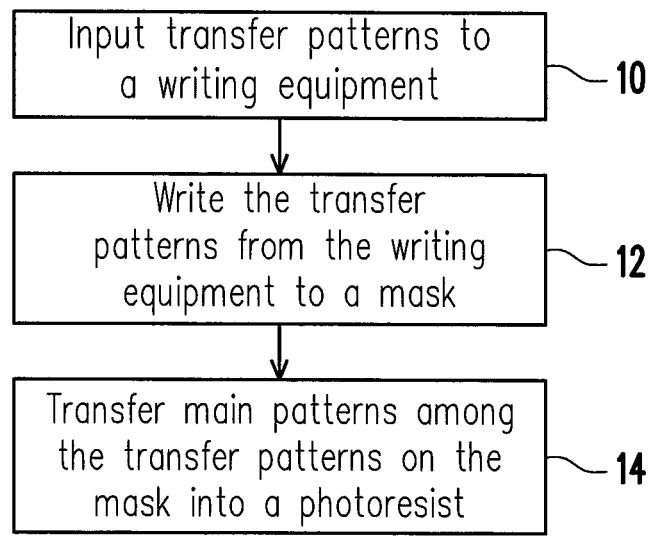
FIG. 2 is a process flow of a feature transfer.
Figure 3:
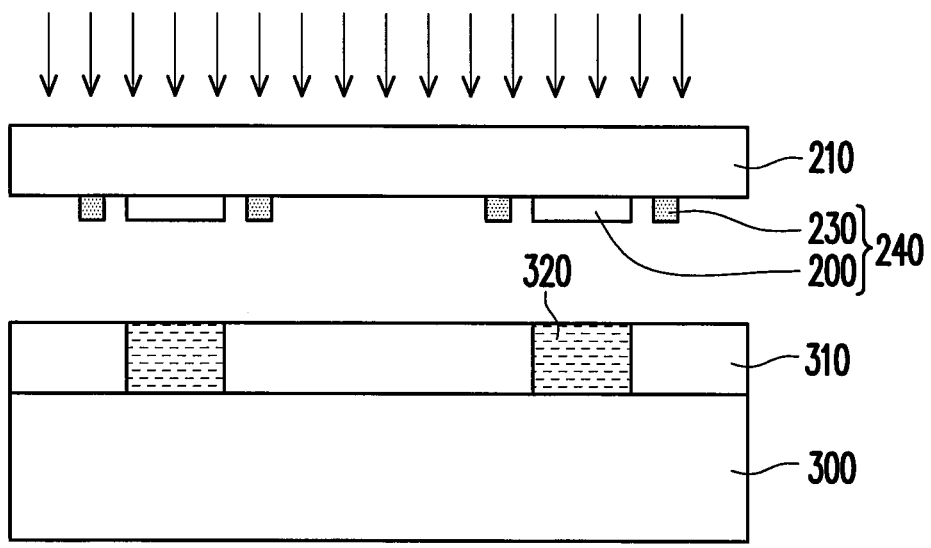
FIG. 3 is a schematic view illustrating a patterning process according to an embodiment of the present invention.

FIG. 2 is a process flow of a feature transfer. FIG. 3 is a schematic view illustrating a patterning process according to an embodiment of the present invention.

Referring to FIG. 2 and FIG. 3, after the transfer features 140 are obtained, the transfer features 140 are input to a writing equipment (Step 10). The writing equipment includes a photomask writing equipment. Thereafter, in Step 12, an electron beam (E-beam) or a laser is used to write the transfer features 140 from the writing equipment into a mask 210, so as to form a plurality of transfer features 240 on the mask 210. Each transfer feature 240 has a main feature 200 and an assistant feature 230. The mask 210 can be a photomask. Afterwards, the mask 210 is applied to a patterning process, such as a photolithography process. The main features 200 among the transfer features 240 on the mask 210 are transferred to a photoresist 310 coated on a substrate 300, so as to form features 320 in the photoresist 310. The photoresist 310 can be a positive photoresist or a negative photoresist. With the assistant features 230 on the mask 210, the main features 200 on the mask 210 can be transferred to the photoresist 310 more accurately, and the required features 320 are thus formed in the photoresist 310.

In summary, in the present invention, rule-based features are pre-distributed around one main feature, and a more accurate model-based feature is then compared to the rule-based features to extract an overlap Boolean feature. Thereafter, the overlap Boolean feature serving as an assistant feature is disposed appropriately around the other main features. Such method can significantly reduce the running time for calculating the assistant features only with the model-based approach, or can greatly increase the accuracy of the assistant features only with the rule-based approach.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of generating an assistant feature executed by a computing system, comprising:
providing a plurality of main features;
selecting a first main feature from the main features;
disposing a plurality of rule-based features around the first main feature;
generating a model-based feature around the first main feature; and extracting an overlap Boolean feature from the rule-based features, wherein the overlap Boolean feature overlaps with the model-based feature in an overlap ratio up to a target value, the overlap Boolean feature serves as an assistant feature, and the assistant feature and the first main feature constitute a transfer feature.

2. The method of claim 1, wherein a profile of the rule-based features is determined by a simulation software.

3. The method of claim 1, further comprising forming the assistant feature around each of the main features other than the first main feature.

4. The method of claim 1, wherein the rule-based features are adjacent to each other.

5. The method of claim 1, wherein the transfer feature is written to a mask.

6. The method of claim 5, wherein the mask is a photomask.

7. The method of claim 6, wherein the photomask is used for a patterning process with a positive photoresist or a negative photoresist.

8. The method of claim 1, wherein the assistant feature comprises a scattering bar.

9. The method of claim 1, wherein the transfer feature is input into a writing equipment.

10. The method of claim 9, wherein the writing equipment comprises a photomask writing equipment.

* * * * *